US009088644B2

(12) United States Patent
Kioski et al.

(10) Patent No.: US 9,088,644 B2
(45) Date of Patent: *Jul. 21, 2015

(54) REMOVABLE SENSOR MODULES

(71) Applicant: Telect, Inc., Liberty Lake, WA (US)

(72) Inventors: Bryan Joseph Kioski, Spokane, WA (US); David Knaggs, Spokane, WA (US); Paul A. Knight, Spokane, WA (US)

(73) Assignee: Telect, Inc., Liberty Lake, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/146,661

(22) Filed: Jan. 2, 2014

(65) Prior Publication Data

US 2014/0119519 A1    May 1, 2014

Related U.S. Application Data

(63) Continuation of application No. 13/287,920, filed on Nov. 2, 2011, now Pat. No. 8,625,748.

(51) Int. Cl.
*H04M 1/24* (2006.01)
*H04M 3/08* (2006.01)
*H04M 3/22* (2006.01)
*H04Q 1/02* (2006.01)
*G01R 19/00* (2006.01)

(52) U.S. Cl.
CPC ............... *H04M 1/24* (2013.01); *G01R 19/00* (2013.01); *H04Q 1/03* (2013.01); *H04Q 1/15* (2013.01)

(58) Field of Classification Search
CPC ............. H04M 1/24; H04Q 1/03; H04Q 1/15; G01R 19/00

USPC ............... 379/1.01, 2, 8, 9.04, 15.01, 15.05, 379/22.06, 27.05, 27.07, 29.03, 29.04, 379/32.01; 340/638, 292, 653, 664; 361/614, 624, 625, 627, 628, 634, 636, 361/104, 622; 307/31, 34, 39, 42; 337/4, 8, 337/49, 186, 187, 191, 198
See application file for complete search history.

(56) References Cited

U.S. PATENT DOCUMENTS 4,616,207 A    10/1986    Knapp, Jr. et al.
5,305,174 A    4/1994    Morita et al.
(Continued)

FOREIGN PATENT DOCUMENTS

EP    1072285 A1    1/2001
EP    2241898 A1    10/2010
(Continued)

OTHER PUBLICATIONS

Non-Final Office Action for U.S. Appl. No. 13/287,920, mailed on Mar. 14, 2013, Bryan Joseph Kioski et al., "Removable Sensor Modules," 9 pages.

(Continued)

Primary Examiner — Binh Tieu
(74) Attorney, Agent, or Firm — Lee & Hayes, PLLC

(57) ABSTRACT

A removable telecommunication sensor module is configured to be removably coupled between a power protection device and a bus bar and/or a backplane. The removable telecommunication sensor module monitors energy usage at a telecommunication equipment circuit level for a piece of telecommunication equipment arranged in a telecommunication network infrastructure.

19 Claims, 9 Drawing Sheets

(56) References Cited

U.S. PATENT DOCUMENTS

| | | |
|---|---|---|
| 6,108,185 A | 8/2000 | Kim et al. |
| 7,423,858 B2 | 9/2008 | Dobbs et al. |
| 2004/0100387 A1 | 5/2004 | Torrez et al. |
| 2005/0013077 A1 | 1/2005 | Gemme et al. |
| 2006/0043961 A1 | 3/2006 | Loy |
| 2006/0077609 A1* | 4/2006 | Bender et al. ............... 361/93.1 |
| 2007/0223160 A1 | 9/2007 | Coffey et al. |
| 2009/0234512 A1 | 9/2009 | Ewing et al. |
| 2010/0280774 A1 | 11/2010 | Ewing et al. |
| 2010/0290605 A1 | 11/2010 | Wright et al. |
| 2011/0255202 A1 | 10/2011 | Hartmann |
| 2011/0286154 A1 | 11/2011 | Coffey et al. |
| 2012/0194969 A1 | 8/2012 | Johnsen |
| 2013/0108027 A1 | 5/2013 | Kioski et al. |
| 2014/0254115 A1* | 9/2014 | Kioski et al. ............... 361/752 |
| 2015/0016029 A1* | 1/2015 | Johnsen ....................... 361/646 |

FOREIGN PATENT DOCUMENTS

| | | |
|---|---|---|
| JP | 7229935 A | 8/1995 |
| JP | 2001221812 A | 8/2001 |
| WO | WO2007143834 A1 | 12/2007 |

OTHER PUBLICATIONS

PCT Search Report mailed Mar. 13, 2013 for PCT application No. PCT/US2012/063354, 9 pages.

The Extended European Search Report mailed May 7, 2015 for European patent application No. 12845963.3, 5 pages.

* cited by examiner

REMOVABLE SENSOR MODULES

RELATED APPLICATION

This application is a continuation of and claims priority to U.S. patent application Ser. No. 13/287,920, filed on Nov. 2, 2011, the disclosure of which is incorporated by reference herein.

BACKGROUND

Existing telecommunications energy monitoring methods are very coarse. For instance, energy management systems and methods have traditionally been utilized at a site level (e.g., a central office site or a wireless site). For example, historically a telecommunication organization simply monitored energy consumption of a single site by way of regularly comparing the site's utility bills from month to month. While this approach helps ensure that the telecommunication site's energy consumption is at least consistent, it does not provide visibility to power consumption by each piece of telecommunication equipment arranged in the telecommunication site.

As such, telecommunications companies are beginning to monitor power consumption at a power distribution system level. Specifically, telecommunications companies are beginning to monitor power consumption at a primary power distribution level (e.g., a battery distribution feeder bay (BDFB)). For example, a telecommunications company may monitor energy consumption of a primary power distribution system by monitoring a current shunt monitor of the primary power distribution system. While this approach provides visibility to power consumption at the primary power distribution level, it also does not provide visibility to power consumption by each piece of telecommunication equipment arranged in the telecommunication site.

In addition, power protection devices exist that have current monitors integrated and/or housed in the power protection device. For example, fuses exist that have a Hall Effect sensor mounted in the fuse assembly to measure a current of the fuse. Circuit breakers exist that have a current sensor assembly structurally fastened to, and integrated (e.g., internally wired) with, the circuit breaker forming a single integrated current sensor/circuit breaker assembly. While this approach provides visibility to power consumption at the equipment level, if the sensor fails, the whole sensor/circuit breaker assembly must be replaced.

SUMMARY

This summary is provided to introduce simplified concepts for removable telecommunication sensor modules and a method of using the same, which is further described below in the Detailed Description. This summary is not intended to identify essential features of the claimed subject matter, nor is it intended for use in determining the scope of the claimed subject matter.

A removable telecommunication sensor module is provided to monitor energy usage at a telecommunication equipment circuit level for a piece of telecommunication equipment arranged in a telecommunication network infrastructure. In one example, a current monitor device may be removeably coupled between a power protection device and a bus bar as a self-contained stand-alone single unit. The self-contained stand-alone current monitor device may be easily inserted into a slot of a power distribution system (e.g., a secondary power distribution panel) and removably coupled to the bus bar. A power protection device may also subsequently be inserted into the same slot and removably coupled to the self-contained current monitor device. One current monitor device may monitor a load output of a piece of telecommunication equipment. In another example, a current monitor device may be removeably coupled between a power protection device and a backplane (e.g., printed circuit board assembly (PCBA)) as a self-contained stand-alone single unit.

The current monitor device may include a power receptacle having a through hole for providing a tool access to a power terminal arranged in-line with the power receptacle. In this way, the through hole allows a user to quickly and easily removably couple the current monitor device, housed in a slot, to and/or from a bus bar.

In another example, the current monitor device may comprise a current monitoring assembly (e.g., a printed circuit assembly (PCA)) arranged in the current monitor device to monitor a current flowing through a power protection device. The current monitoring assembly may be configured to report a signal based on the monitored current. The current monitor device may further comprise alarm contact receptacles to removably couple with cooperating alarm contacts of the power protection device. The current monitoring assembly may receive trip status signals from the alarm contacts and pass these trip status signals generated by the power protection device to a central control board. Further, the current monitoring assembly may also manipulate the monitored current to be outside a valid current range based on the trip status signals. This provides for the current monitoring assembly to indicate to a user that either the piece of telecommunication equipment arranged in-line with the power protection device is powered off or, alternatively, that the power protection device itself has tripped.

BRIEF DESCRIPTION OF THE DRAWINGS

The detailed description is described with reference to the accompanying figures. The use of the same reference numbers in different figures indicates similar or identical items.

DETAILED DESCRIPTION

Overview

Figure 1A:
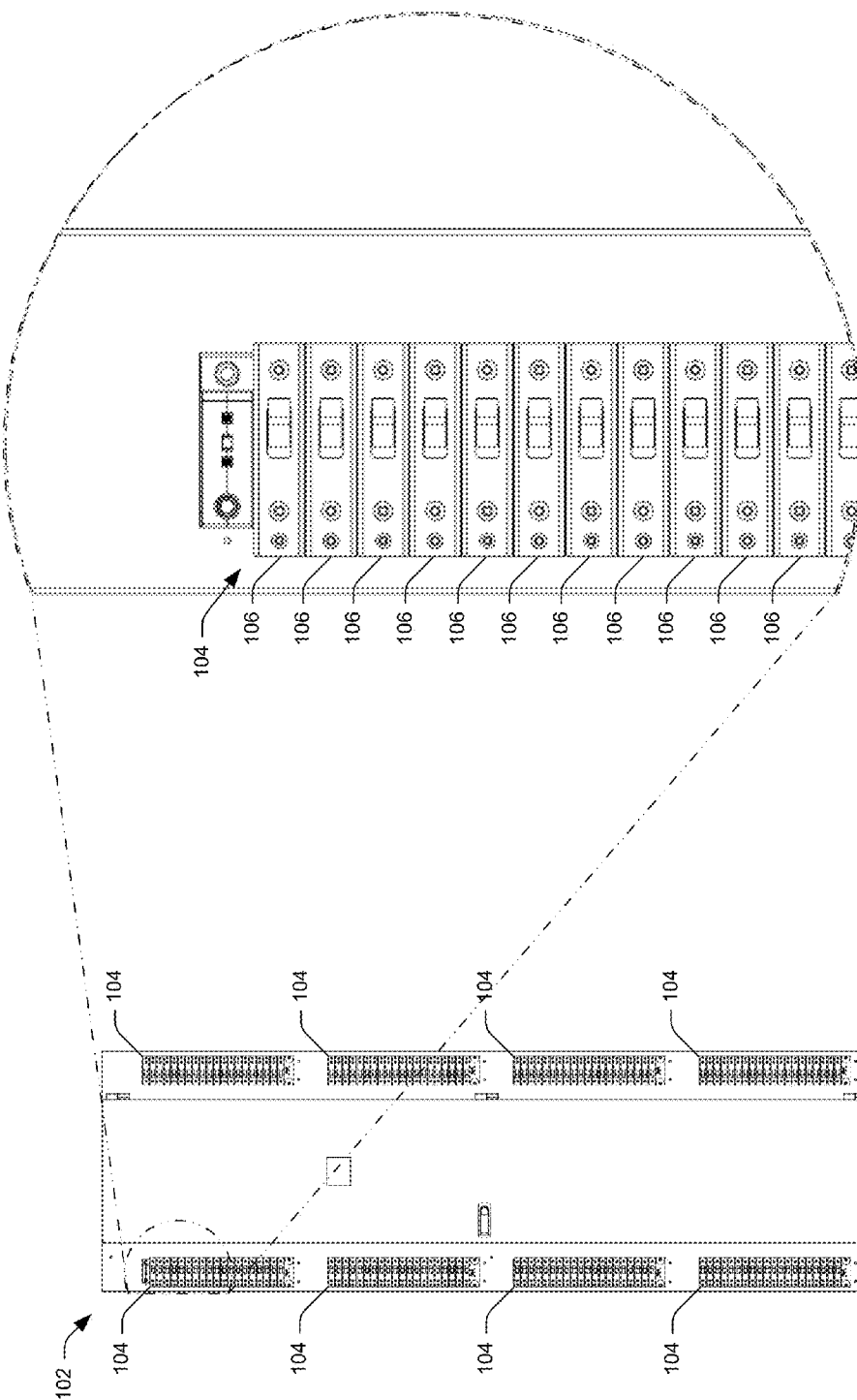
FIG. 1A illustrates an example telecommunications cabinet including power distribution systems having power protection devices installed in slots of the power distribution systems.

This disclosure is directed to removable telecommunication sensor modules and a method of using the same. The removable telecommunication sensor modules are easily installed and/or replaced. The removable sensor modules may comprise a housing containing a mini-bus bar to provide for connecting a power protection device and a bus bar. The mini-bus bar may include a power receptacle arranged in-line with a power terminal. The power receptacle may be disposed in a first surface of the housing to removably couple with a power plug of the power protection device. The power terminal may protrude from a second surface opposite the first surface to removably couple with a bus bar. The power receptacle may have a through hole providing a tool access to the power terminal to fasten the power terminal to and/or detach the power terminal from a bus bar. With the through hole providing a tool access to the power terminal arranged in-line with the power receptacle, the removable sensor modules may be quickly and easily installed and/or replaced. For example, a user may simply remove a commercial off-the-shelf (COTS) breaker from a breaker panel, gaining access to a removable sensor module behind the COTS breaker, loosen the power terminal from the bus bar via the through hole in the power terminal, and remove the removable sensor module. To install/replace the removable sensor module, the user may simply insert the removable sensor module into the slot of the breaker panel, tighten the power terminal to the bus bar via the through hole in the power terminal, and insert a COTS breaker into the slot of the breaker panel, coupling the COTS breaker with the removable sensor module.

The removable sensor module may also contain a current monitoring assembly (e.g., a printed circuit assembly (PCA)). The current monitoring assembly may be arranged in the housing of the removable sensor module to be directly next to the mini-bus bar. The current monitoring assembly may include a current monitor (e.g., a current sensor mounted on a printed circuit assembly (PCA)) coupled to the mini-bus bar. The current monitor may monitor and report a current flowing through the mini-bus bar. In some implementations, the current monitor may be a Hall Effect current monitor disposed on a current monitor board coupled to the mini-bus bar.

The removable sensor modules may comprise a printed circuit assembly (PCA) having a receptacle fixed to a first end of the PCA, and power input and power output receptacles fixed to a second end of the PCA opposite the first end. The PCA may provide for connecting the removable sensor modules to a power protection device and/or a backplane.

Because, in this example, the removable sensor modules are self-contained single units, the removable sensor modules may be installed in the same single slot as a commercial off-the-shelf (COTS) breaker and/or fuse. This provides for cost effective replacement and upgrade. For example, because the removable sensor modules are self-contained single units a user may simply replace a removable sensor module without having to replace a breaker and/or a fuse as well. Further, because the removable sensor modules are self-contained single units a user may simply replace a breaker and/or a fuse without having to replace a sensor. In addition, because the removable sensor modules may be installed in the same single slot as a commercial off-the-shelf (COTS) breaker and/or fuse, a breaker and/or fuse panel density (i.e., number of breaker slots and/or fuse slots per one rack unit (1 RU)) may be maintained. For example, because the removable sensor modules are self-contained as single units, the power protection devices remain intact. This eliminates any modification of the power protection devices. As such, the size of the power protection devices remains intact (i.e., remains stock COTS size) and likewise the breaker and/or fuse panel density remains intact. Further, the function of the power protection devices remains intact and as such the reliability of the power protection devices remains intact.

While the illustrated embodiments show secondary power distribution panels comprising breakers and/or fuses, the breakers and fuses may be of any type of power protection devices suitable for use in power systems. For example the breakers and/or fuses may be TPS, TLS, breakers, KTK, KLM, TPC, GMT "grasshopper" type power protection devices. Further, while the illustrated embodiments show secondary power distribution panels suitable for powering telecommunications equipment configured to utilize −48 VDC, +24 VDC, or other voltages, suitable for powering telecommunications equipment, the secondary power distribution panels may be of any type of power distribution panels. For example, the power distribution panels may be a distribution board, panel board, electrical panel, service panel, load center, or the like.

Example Power Protection Systems

Figure 1B:
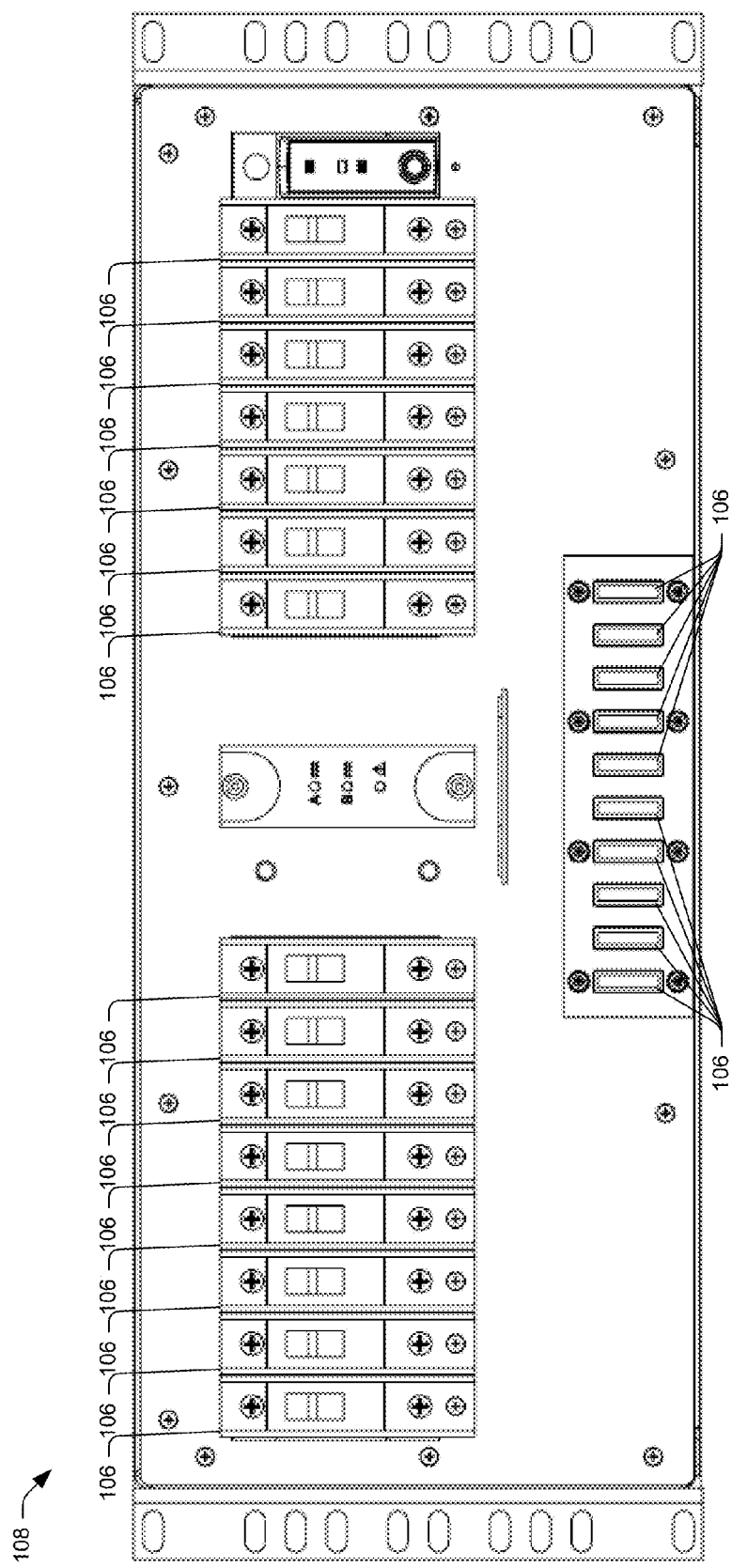
FIGS. 1B and 1C illustrate example telecommunications power distribution system having power protection devices installed in slots in the fronts of the power distribution systems.
Figure 1C:
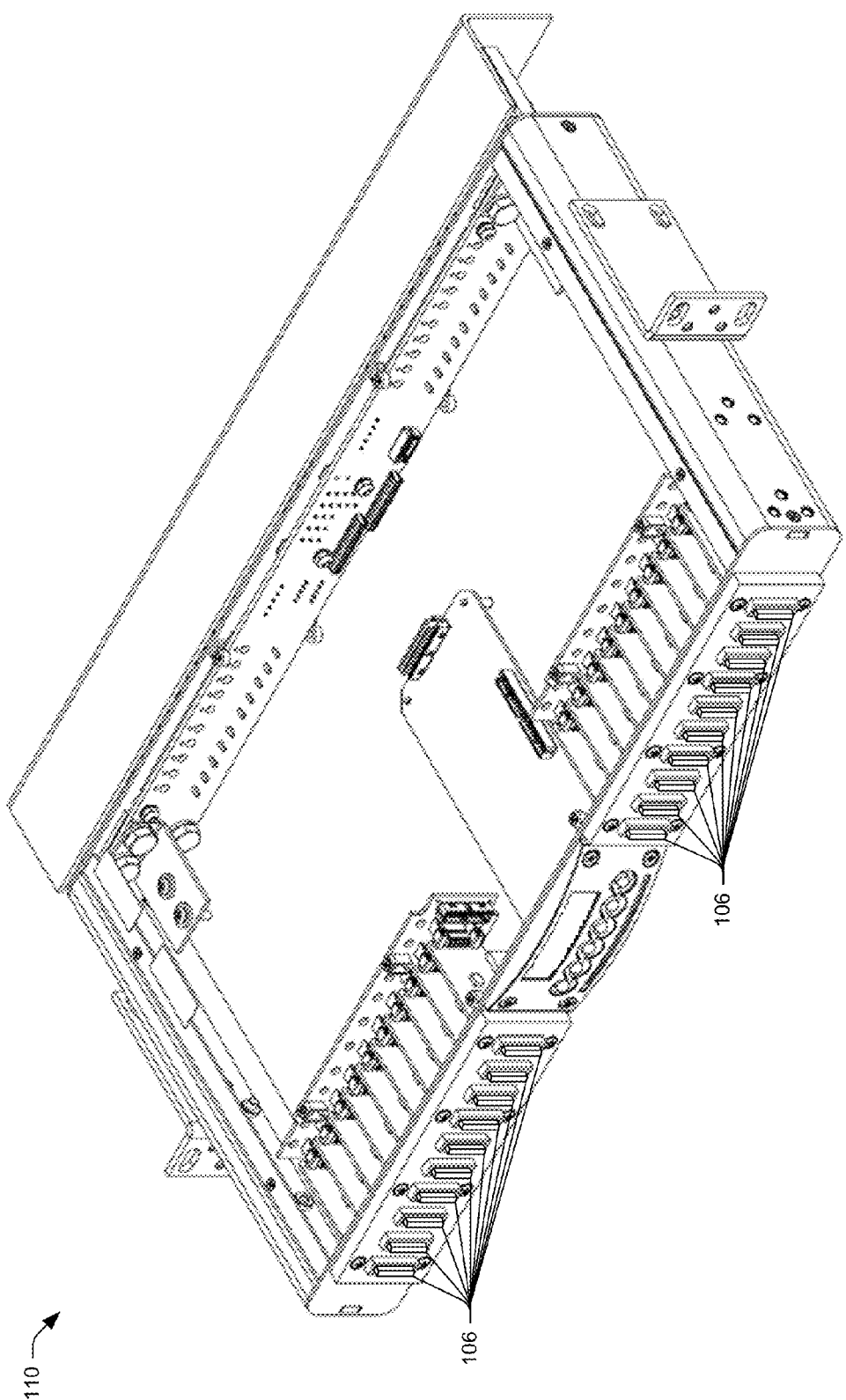

FIG. 1A illustrates an example telecommunications cabinet 102 including power distribution systems 104 having power protection devices 106 installed in slots in a front of the power distribution systems 104. FIG. 1B illustrates an example telecommunications power distribution system 108 having power protection devices 106 installed in slots in a front of the power distribution system 108. FIG. 1C illustrates another example telecommunications power distribution system 110 having power protection devices 106 installed in slots in a front of the power distribution system 110.

A cabinet 102 may be configured in a variety of ways to maintain or hold a plurality of components in a telecommunications infrastructure. For example, a cabinet 102 may be configured as a cabinet for a primary power distribution panel (e.g., a BDFB), a secondary power distribution panel (e.g., a breaker panel and/or a fuse panel) a housing, a terminal block, a panel, a chassis, a digital cross-connect, a switch, a hub, a rack, a frame, a bay, a module, an enclosure, an aisle, or other structure for receiving and holding a plurality of components.

Power distribution systems 108 and 110 may be configured in a variety of ways to provide power distribution in a single compact unit. For example, the power distribution systems 108 and 110 may be configured as breaker panels, fuse panels, dual-feed panels, combination breaker/fuse panels, combination dual-feed breaker/fuse panels, or the like. For example, the power distribution system 108 may be a combination dual-feed breaker/fuse panel and the power distribution system 110 may be a dual-feed fuse panel. The power distribution systems 108 and 110 may be configured to be installed in a cabinet, a rack, an enclosure, a chassis, a housing, or the like. For example, the power distribution system 108 may be installed in a rack and consume four rack units (4 RUs) of the rack. Further, the power distribution system 110 may be installed in a rack and consume 1 RU of the rack.

The power protection devices 106 may have standard dimensions that drive, or otherwise constrain, the dimensions of the slots. The power protection devices 106 may also drive, or otherwise constrain, the dimensions of removable sensor modules that may be installed in each of the slots. For example, the power protection devices 106 may be bullet-style circuit breakers to provide for pressing into a slot for installation. The bullet-style circuit breakers may have standard widths, lengths, and heights that are in a standards agency's compliance (e.g., Underwriters Laboratories (UL), Network Equipment Building Systems (NEBS), or the like).

Further, the power protection devices 106 may be GMT-style fuses to provide for pressing into a slot for installation. Similarly the GMT-style fuses may have standard widths, lengths, and heights that are in a standards agency's compliance (e.g., Underwriters Laboratories (UL), Network Equipment Building Systems (NEBS), or the like). In either embodiment, the standard widths, lengths, and/or heights may constrain the dimensions of the slots.

Example Monitoring Systems

Figure 2:
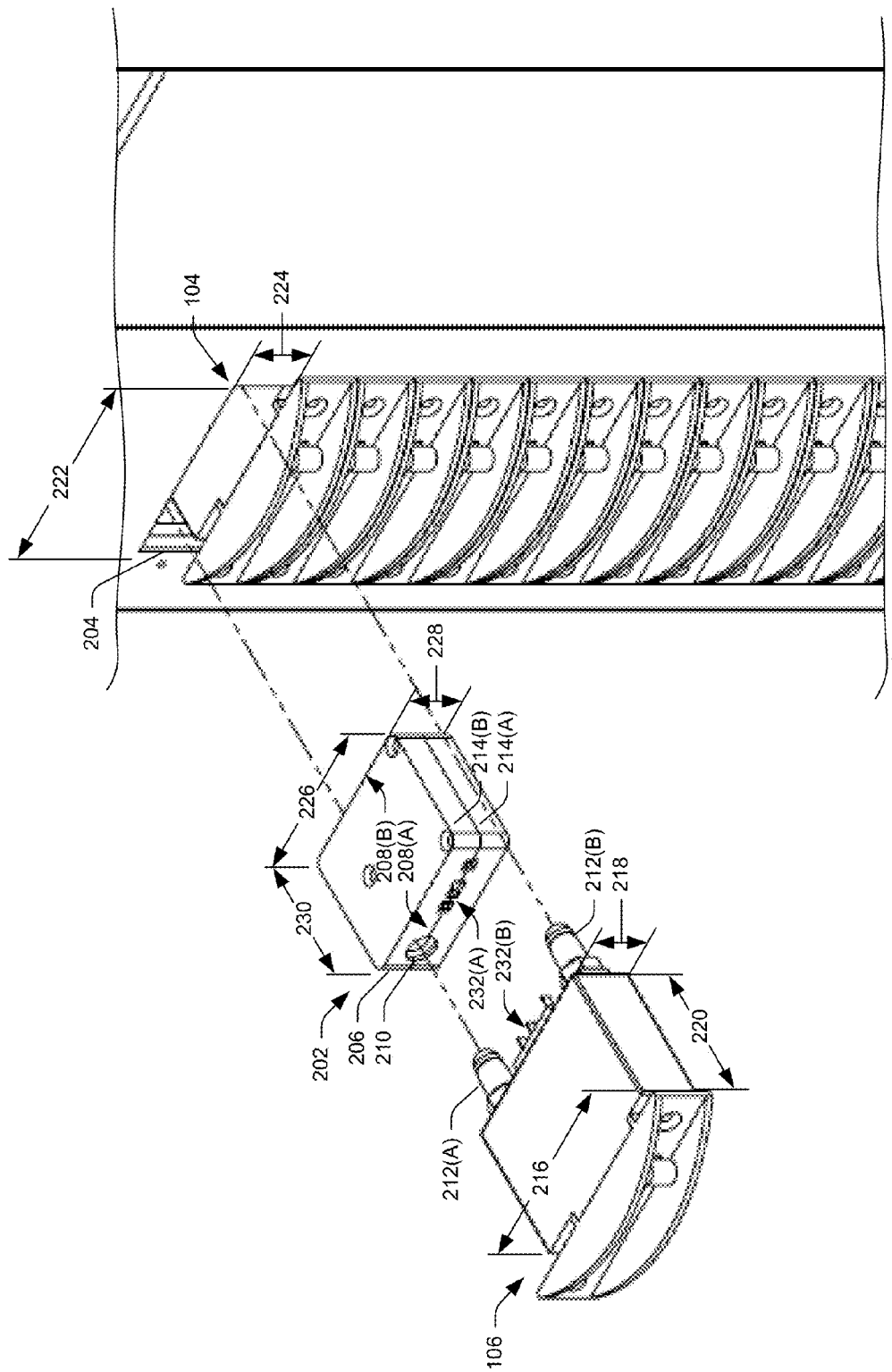
FIG. 2 illustrates an example implementation of a current monitoring device for use in the power distribution systems of FIGS. 1A and 1B.

FIG. 2 illustrates an example implementation of a current monitoring device 202 for use in the power distribution system 104 and in the power distribution system 108 of FIGS. 1A and 1B, respectively. The current monitoring device 202 may be inserted as a single unit into a slot 204 of the power distribution system 104. For example, a user can easily install and/or replace a current monitoring device 202 which requires only front access because of the current monitoring device 202 blind mate installations. This provides for replacing failed current monitoring devices 202 and upgrading from "non-monitoring" to monitoring current monitoring devices 202 (discussed below with respect to FIG. 3). Further, this provides for switching to a different current range (e.g., switching from a 60 A max version to a 125 A max version). A blind mate installation as used herein comprises a mating action that happens where you cannot see the connectors when mating (e.g., connecting) connectors. For example, a connector may be on a back of a current monitoring device (e.g., current monitoring device 202) that is to be mated (e.g., connected and/or plugged) with a cooperating connector inside a power distribution system (e.g., power distribution system 104). As such, the mating of the connector with the cooperating connector inside the power distribution system is not visible.

The current monitoring device 202 may include a housing 206 having a first surface 208(A) opposite a second surface 208(B). While the first and second surfaces 208(A) and 208(B) are illustrated as being planar surfaces, the first and second surfaces 208(A) and 208(B) may be spherical. For example, first and second surfaces 208(A) and 208(B) may be convex and/or concave. The current monitoring device 202 may also include a power receptacle 210. The power receptacle 210 may be disposed in the first surface 208(A) to removably couple with a power plug 212(A) of the power protection device 106. The power protection device 106 may also have another power plug 212(B) which, as FIG. 2 illustrates, may not removably couple with the current monitoring device 202. Instead, the other power plug 212(B) may removably couple to an internal electrical component (e.g., a bus bar, a backplane, a harness, etc.) or some other power distribution equipment.

The housing 206 may be formed of a plastic, metal, composite, or the like and may include a first portion 214(A) and a cooperating second portion 214(B) fastened to the first portion. The housing 206 may have external dimensions that are driven, or otherwise constrained by the dimensions of the power protection device 106, and likewise the dimensions of the slot 204. For example, the power protection device 106 may be a bullet-style circuit breaker having a standard width 216 of about 2.49 inches, a standard height 218 of about 0.75 inches, and a depth 220 of about 1.86 inches. The plugs 212(A) and 212(B) (i.e., bullets) may have a length of about 0.9 inches. The slot 204 may have an opening also having dimensions driven by the dimensions of the power protection device 106. For example, the slot 204 may have an opening having dimensions capable of receiving a portion of the bullet-style circuit breaker. In this embodiment, where the slot has an opening to receive a bullet-style circuit breaker, the slot may have an opening having a width 222 of about 2.55 inches and a height 224 of about 0.78 inches. As such, the housing 206 may have a width 226 of about 2 inches, a height 228 of about 0.75 inches, and a depth 230 of about 1.8 inches for cooperating with the slot 204 and the power protection device 106. More specifically, the first and second surfaces 208(A) and 208(B) of the housing 206 may each be about the same width 226 and height 228. For example, each of the first and second surfaces 208(A) and 208(B) may have a width of about 0.85 times a width of a power protection device. For example, each of the first and second surfaces 208(A) and 208(B) may have a width of about 0.85 times the width 216. Stated otherwise, the second surfaces 208(A) and 208(B) may have a width some amount less than the width of the power protection device 106.

FIG. 2 illustrates the current monitoring device 202 may include alarm contact receptacles 232(A) disposed in the first surface 208(A). The alarm contact receptacles 232(A) may removably couple with cooperating alarm contacts 232(B) of the power protection device 106. The power protection device 106 may pass trip status signals generated by the power protection device 106 to a central control board. For example, the power protection device 106 may pass trip status signals from the alarm contacts 232(B) to the alarm contact receptacles 232(A) and subsequently, pass the trip status signals to a central control board via a backplane, a central monitoring board, a harness, a cable, or other electrical interconnection equipment.

While FIG. 2 illustrates a current monitoring device 202 for removably coupling with a bullet-style circuit breaker, the current monitoring device 202 may be for removably coupling with any other type of power protection device suitable for protecting equipment arranged in-line with the current monitor device. For example, the power protection device may be a single-pole circuit breaker, a double-pole circuit breaker, a triple-pole circuit breaker, a mid-trip circuit breaker, an instantaneous-trip breaker, or the like, power protection device. Further, the power protection device may be a fuse (e.g., a TPS fuse, a TLS fuse, a KTK fuse, a KLM fuse, a TPC fuse, a GMT fuse, etc.) type power protection device.

Figure 3:
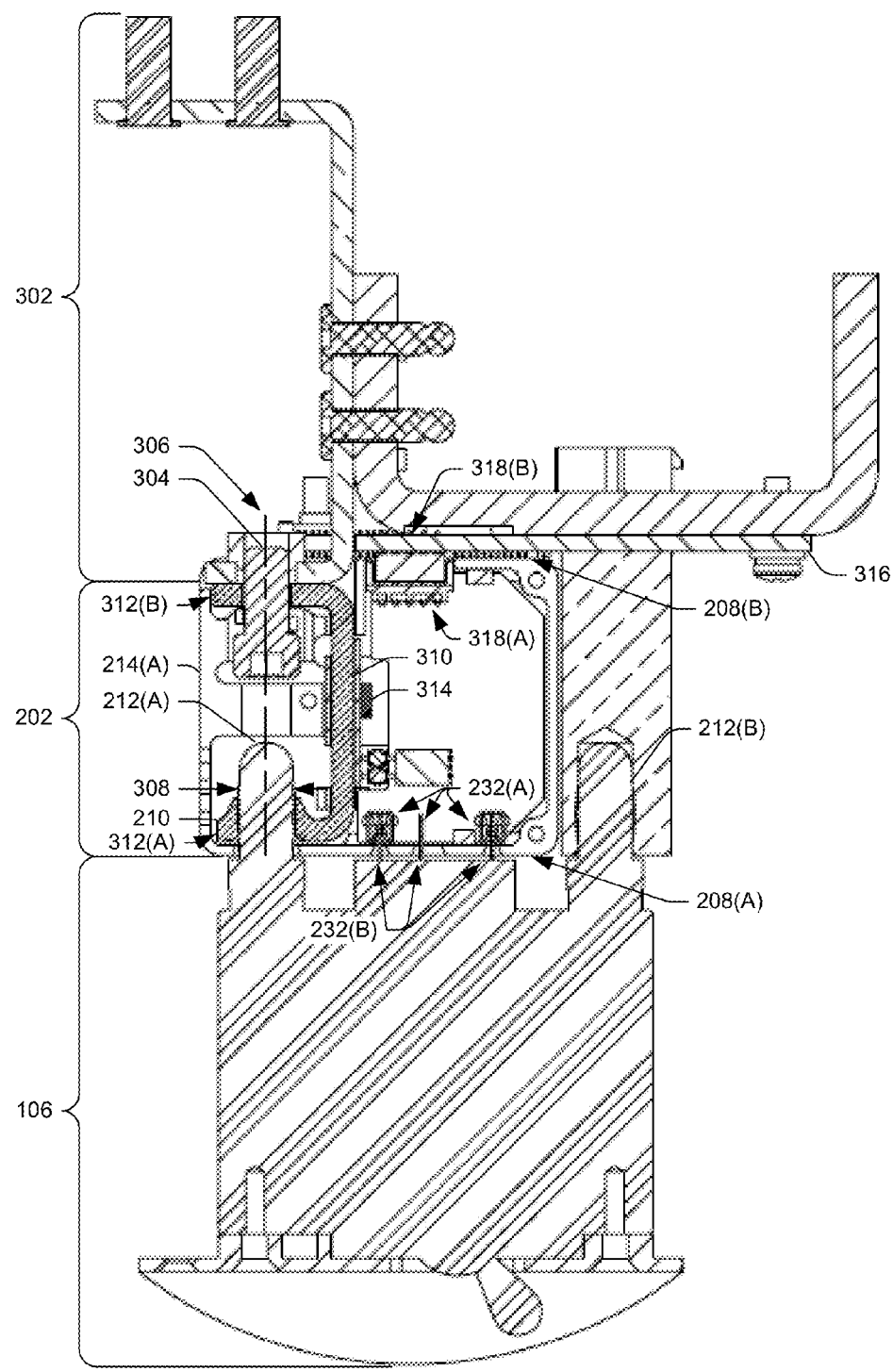
FIG. 3 is a top section view of a current monitoring device installed in a slot of a power distribution system housed by a telecommunications cabinet.

FIG. 3 is a top section view of a current monitoring device installed in a slot of a power distribution system housed by a telecommunications cabinet. FIG. 3 illustrates the current monitoring device 202 removably coupled between the power protection device 106 and a bus bar 302. The power plug 212(A) of the power protection device 106 is illustrated as being removably received by the power receptacle 210 of the power protection device 106. The alarm contacts 232(B) of the power protection device 106 are illustrated as being removably coupled with cooperating alarm contact receptacles 232(A) of the current monitoring device 202. Further, FIG. 3 shows the housing 206 with the second portion 214(B) of the housing 206 removed, and the first portion 214(A) of housing 206 exposed.

FIG. 3 illustrates a power terminal 304 protruding from the second surface 208(B). The power terminal 304 is illustrated as being arranged in-line, along a center line 306, with the power receptacle 210. The power terminal 304 to removably couple with the bus bar 302. While FIG. 3 illustrates the power terminal 304 being a threaded fastener, the power terminal 304 may be a quick-disconnect fastener, interference fastener, or the like. The power receptacle 210 may include a through hole 308 providing access to the power terminal 304 to removably couple the current monitoring device 202 to an/or from the bus bar 302. For example, the through hole 308 may provide for a tool (e.g., a screw driver) to access the power terminal 304 (when the power protection device 106 is not installed in the slot) to fasten the power terminal 304 to and/or from the bus bar 302.

A mini-bus bar 310 may be arranged in the first portion 214(A) of the housing 206. The mini-bus bar 310 may connect the power receptacle 210 and the power terminal 304. FIG. 3 illustrates the power receptacle 210 and the power terminal 304 concentrically arranged in a first tab 312(A) and a second tab 312(B) of the mini-bus bar 310, respectively. For example, the power receptacle 210 and the power terminal 304 are shown in FIG. 3 being arranged concentric with, and opposite to each other along center line 306. A current monitor 314 may be coupled to the mini-bus bar 310. The current monitor 314 may monitor and report a current flowing through the mini-bus bar 310. For example, the current monitor 314 may monitor and report a current flowing from the power protection device 106, through the mini-bus bar 310, to the bus bar 302, and to a load (e.g., a piece of telecommunications equipment). Because the current flows through the power protection device 106 before the current monitoring device 202, when the power protection device 106 is removed their will be no voltage passing to the load. This provides for installation and/or replacement of a current monitoring device 202 while leaving power to the rest of the current monitoring devices 202 in the power distribution system 104. Current monitor 314 may be, for example, Hall Effect current monitors, although any other efficient (and potentially low cost) current sensors may be implemented. The Hall Effect current monitors may be purchased from a supplier. For example, the Hall Effect current monitors may be purchased from the following suppliers: Melexis Microelectronic Systems, located at Rozendaalstraat 12, B-8900 Ieper, Belgium; Allegro MicroSystems, Inc., located at 115 Northeast Cutoff, Worcester, Mass. 01606 USA; Analog Devices Inc. located at 3 Technology Way Norwood, Mass. 02062; or Honeywell International Inc., located at 101 Columbia Road Morristown, N.J. 07962.

While FIG. 3 illustrates a current monitoring device 202 having a current monitor 314 coupled to the mini-bus bar 310, current monitoring device 202 may not have a current monitor 314 coupled to the mini-bus bar 310. In this implementation, the current monitor device 202 may be devoid of current monitoring hardware and may be a "non-monitoring" current monitoring device 202. For example, the "non-monitoring" current monitoring device 202 may pass a current from the power protection device 106 to the bus bar 302 via the mini-bus 310. In addition, the "non-monitoring" current monitoring device 202 may receive trip status signals (e.g., alarm signals) generated by the power protection device 106 via the alarm contact receptacles 232(A) removably coupled with cooperating alarm contacts 232(B). By providing a "non-monitoring" current monitoring device 202, this can be advantageous for a customer who may want to purchase a power distribution system 104 that does not require per circuit current monitoring at the time of purchase, but may wish to upgrade in the future. For example, a customer may install a piece of telecommunications equipment that the customer wants to monitor individually. In this example, the customer may simply remove the "non-monitoring" current monitoring device 202 and install a current monitoring device 202 that contains the necessary current monitoring hardware.

FIG. 3 illustrates a backplane 316 arranged between the current monitoring device 202 and the bus bar 302. The current monitoring device 202 may comprise signal pins 318 (A) removably coupled with cooperating receptacles 318(B) of the backplane 316. While FIG. 3 illustrates a backplane 316 having cooperating receptacles 318(B), a harness may have cooperating receptacles 318(B). For example, cooperating receptacles of a harness may be arranged between the current monitoring device 202 and the bus bar 302 via a bracket, or some other fastening mechanism to removably couple with the signal pins 318(A). The signal pins 318(A) may be disposed in the second surface 208(B). For example a connector having the signal pins 318(A) may be disposed in the second surface 208(B) to removably connect with a cooperating connector having the cooperating receptacles 318(B). The removably coupled signal pins 318(A) disposed in the second surface 208(B) may pass signals to a central control board. Further, a current monitoring board may comprise one or more digital inputs and/or outputs, one or more analog inputs and/or outputs, and be communicatively coupled with power sensors.

Figure 4:
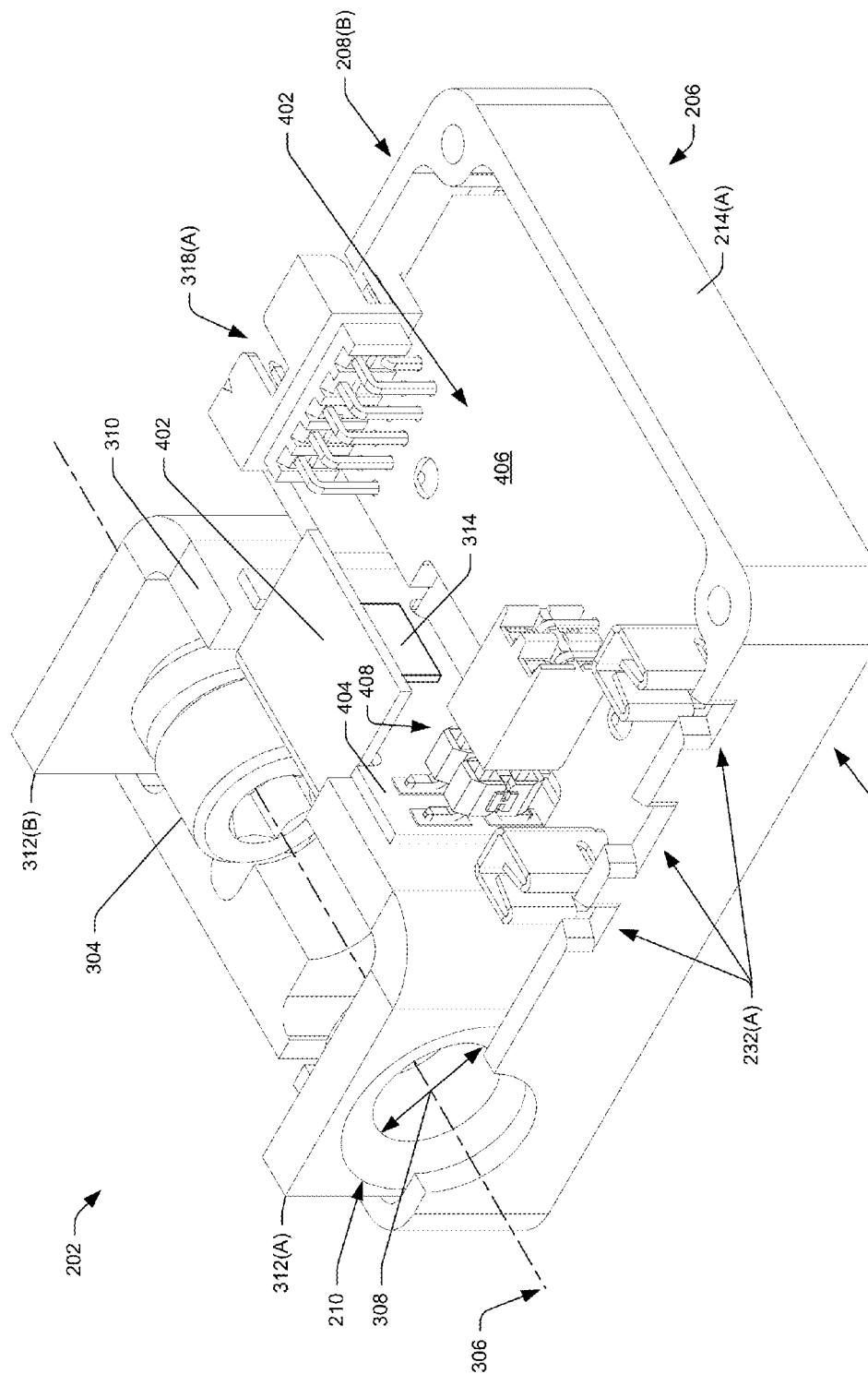
FIG. 4 illustrates an example internal assembly of a current monitoring device.

FIG. 4 illustrates an example internal assembly of a current monitoring device 202. The current monitoring device 202 may include a current monitoring assembly 402 that may be enclosed by the housing 206. The current monitoring assembly 402 may be arranged in the first portion 214(A) of the housing 206 and juxtaposed to the mini-bus bar 310. The current monitoring assembly 402 may include the current monitor 314 coupled to the mini-bus bar 310 to monitor and report a current flowing through the mini-bus bar 310. The current monitor 314 may be disposed on a current monitor board 404 (e.g., a printed circuit assembly (PCA)) and the current monitor board 404 may be disposed on the mini-bus bar 310. The current monitor board 404 may be connected to a central board 406 in about a perpendicular orientation via a pin and socket interconnection 408. A magnetic shield 410 may be fixed to the mini-bus bar 310 for shielding the current monitor 314. The central board 406 of the current monitoring assembly 402 may include the alarm contact receptacles 232 (A) that may removably couple with cooperating alarm contacts 232(B) of the power protection device 106. The alarm contact receptacles 232(A) may pass trip status signals generated by the power protection device 106 to a central control board. The current monitoring assembly 402 may include the signal pins 318(A) that may removably couple with cooperating receptacles 318(B) of the backplane 316, or a cable harness, to pass signals to a central control board.

The current monitoring device 202 may provide for indicating to a user that a piece of telecommunication equipment arranged in-line with the power protection device (i.e., the load) is powered off or, alternatively, that the power protection device 106 has tripped. For example, the current monitoring assembly 402 may manipulate a monitored current received from the current monitor 314 to be outside a valid current range based on a trip status signal generated by the power protection device 106. In this example, the valid current range may be a pulse-width modulation duty cycle range of approximately 10-90% and the current monitoring assembly 402 may force the monitored current to a pulse-width modulation duty cycle of approximately 0% based on a presence of a voltage on the alarm contact receptacles 232(A) generated by the power protection device 106. Alternatively, the valid current range may be an analog range of approximately 1-4 volts, and the current monitoring assembly 402 may force the monitored current to approximately 0 volts based on a presence of a voltage on the alarm contact receptacles 232(A) generated by the power protection device 106. By manipulating a monitored current, this provides for a user (i.e., a controller) monitoring the signals provided by the current monitoring device 202 to know if the power protection device 106, or a fuse, is in a tripped state without needing discrete alarm signals from each piece of telecommunication equipment arranged in-line with the power protection device 106.

Figure 5:
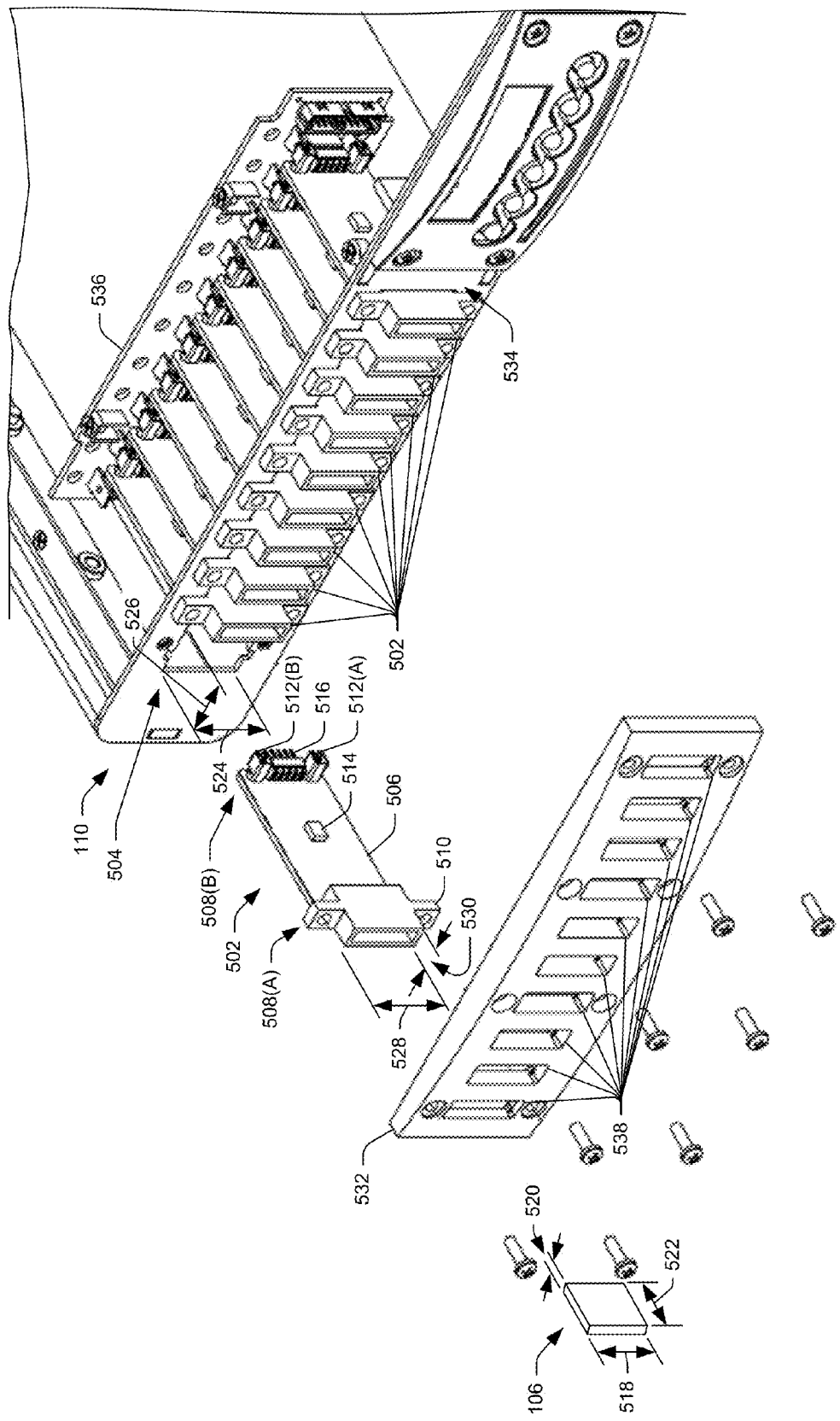
FIG. 5 illustrates an example implementation of a current monitoring device for use in the power distribution systems of FIGS. 1B and 1C.

FIG. 5 illustrates an example implementation of a current monitoring device 502 for use in the power distribution system 108 and the power distribution system 110 of FIGS. 1B and 1C. The current monitoring device 502 may be inserted as a single unit into a slot 504 of the power distribution system 110. For example, a user can easily install and/or replace a current monitoring device 502 which requires only front access because of the current monitoring device 502 blind mate installations. This provides for replacing failed current monitoring devices 502 or upgrading from "non-monitoring" to monitoring current monitoring devices 502 (discussed below with respect to FIG. 6). Further, this provides for switching to a different current range (e.g., switching from a 15 A max version to a 20 A max version).

The current monitoring device 502 may include a printed circuit assembly (PCA) 506. The PCA 506 may have a first end 508(A) opposite a second end 508(B). A receptacle 510 may be fixed to the first end 508(A). The receptacle 510 may provide for removably coupling with a power protection device 106. For example, the receptacle 510 may be a fuse holder (e.g., a GMT type fuse holder) fixed to the first end 508(A) of the PCA 506. While the receptacle 510 is illustrated as comprising a GMT type fuse holder, the receptacle may be a KTK, KLM, TPA, TPC, TPS, TLS or the like, type fuse holder. The current monitoring device 502 may comprise a power input and power output receptacles 512(A) and 512 (B), respectively, fixed to the second end 508(B) of the PCA 506. The power input and power output receptacles 512(A) and 512(B) may provide for removably coupling with an internal electrical component (e.g., a backplane, a harness, a bus bar, etc.).

The current monitoring device 502 may comprise a current monitor 514 arranged on the PCA 506 between the first end 508(A) and the second end 508(B). The current monitor 514 may provide for monitoring a current flowing through the current monitoring device 502 and reporting of a signal based on the monitored current. The current monitor 514 may be a Hall Effect current monitor. While FIG. 5 illustrates a current monitoring device 502 having a current monitor 514 arranged on the PCA 506, the current monitoring device 202 may not have a current monitor 514 arranged on the PCA 506. In this implementation, the current monitor device 502 may be devoid of current monitoring hardware and may be a "non-monitoring" current monitoring device 502. For example, the "non-monitoring" current monitoring device 202 may pass a current from the power protection device 106 to an internal electrical component (e.g., a backplane, a harness, a bus bar, etc.) via electrical traces formed in the PCA 506.

The current monitoring device 502 may comprise signal pins 516 fixed to the second end 508(B). The signal pins 516 may provide for removably coupling with cooperating receptacles of an internal electrical component (e.g., a backplane, a harness, a bus bar, etc.).

The current monitoring device 502 may have external dimensions that are driven, or otherwise constrained by the dimensions of the power protection device 106, and likewise the dimensions of the slot 504. For example, the power protection device 106 may be a GMT type fuse having a standard height 518 of about 0.7 inches, a standard width 520 of about 0.1 inches, and a depth 522 of about 0.8 inches. The slot 504 may have an opening also having dimensions driven by the dimensions of the power protection device 106. For example, the slot 504 may have an opening having dimensions capable of receiving a portion of the GMT type fuse. In this embodiment, where the slot 504 has an opening to receive a GMT type fuse, the slot 504 may have an opening having a height 524 of about 1 inch and a width 526 of about 0.5 inches. As such, the current monitoring device 502 may have a height 528 of about 0.8 inches and a width 530 of about 0.4 inches for cooperating with the slot 504 and the power protection device 106.

A cover 532 may be removably fastened to a front surface 534 of the power distribution device 110. The cover 532 may provide for securing each current monitoring device 502 in a respective slot 504. For example, a user can easily removably install each current monitoring device 502 as a single unit into a slot 504 of the power distribution system 110 via a blind mate installation. For example, a user may insert a current monitoring device 502 into a slot 504 and removably disconnect the power input 512(A), power output 512(B), and signal pins 516, to a backplane 536. A user may then subsequently removably fasten the cover 532 to the front surface 534, securing each current monitoring device 502. For example, the cover 532 may comprise an opening 538 to receive at least a portion of each current monitoring device 502. For example, each opening 538 may receive a portion of each receptacle 510 of each current monitoring device 502. While the power distribution device 110 is illustrated as including a cover 532 for securing each current monitoring device 502, the power distribution device 110 may not include a cover 532. For example, each current monitoring device 502 may comprise a front plate (e.g., a faceplate) that may secure to the front surface 534. For example, each current monitoring device 502 may comprise a front plate that provides for fastening the current monitor device 502 to the front surface 534 via a snap fit, press fit, twist lock type fastener, threaded fastener, or the like.

Figure 6:
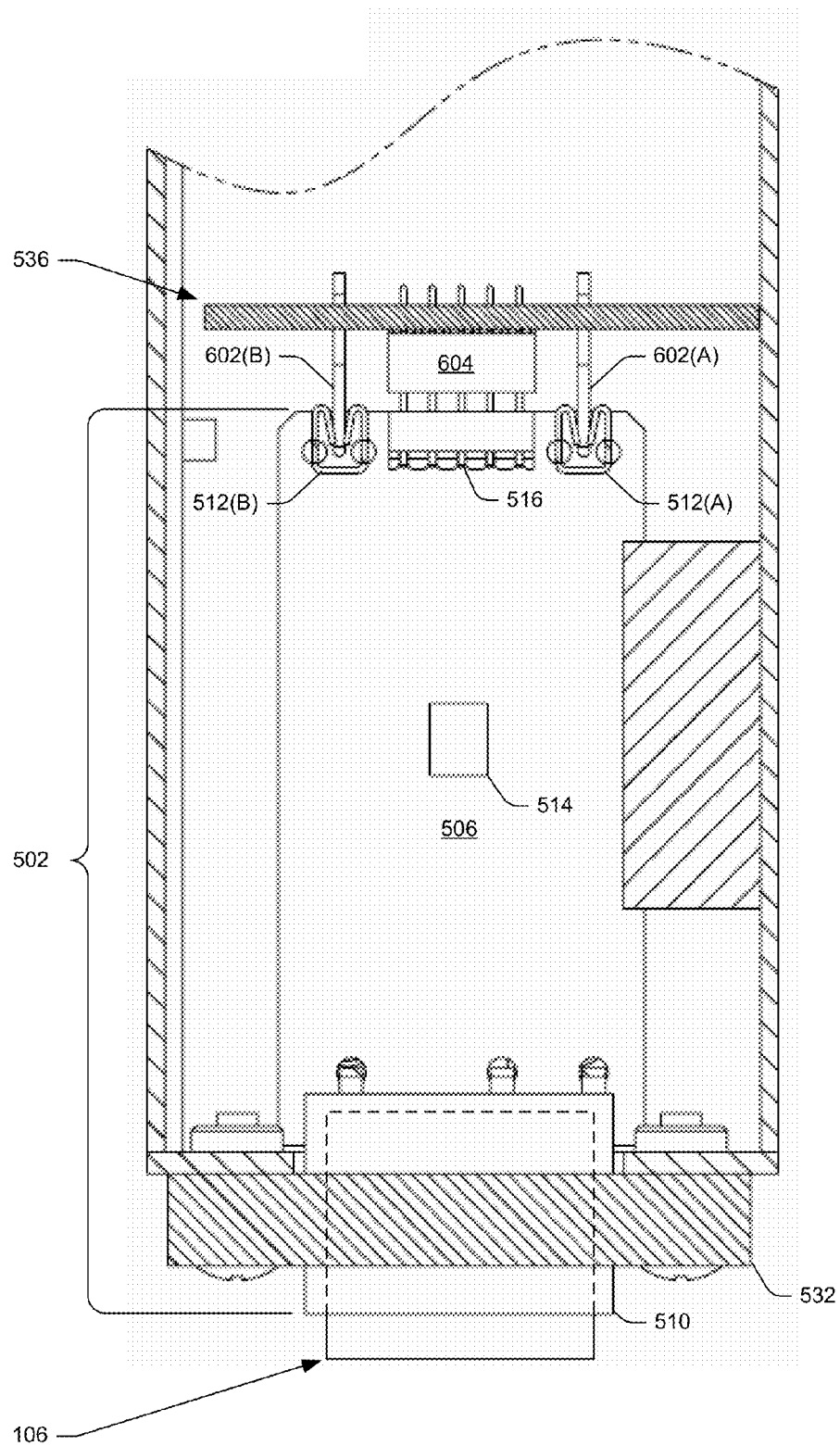
FIG. 6 is a top section view of a current monitoring device installed in a slot of the power distribution system of FIG. 1C.

FIG. 6 is a top section view of a current monitoring device installed in a slot of a power distribution system. FIG. 6 illustrates the current monitoring device 502 removably coupled between the power protection device 106 and the backplane 536. A portion of the power protection device 106 is illustrated as being removably coupled with the receptacle 510.

The backplane 536 may comprise cooperating power input and power output studs 602(A) and 602(B), respectively, fixed to the backplane 536. The cooperating power input and power output studs 602(A) and 602(B) may be removably received by the power input and power output receptacles 512(A) and 512(B), respectively. For example, a user may insert the current monitoring device 502 into a slot 504 and mate the power input and power output receptacles 512(A) and 512(B) with the cooperating power input and power output studs 602(A) and 602(B).

The backplane 536 may comprise cooperating receptacles 604. While FIG. 6 illustrates cooperating receptacles 604 fixed to the backplane 536, the cooperating receptacles 604 may be fixed to an end of a harness, a cable, a wire or the like. A connector may house the signal pins 516 and a cooperating connector may house the cooperating receptacles 604. The connector housing the signal pins 516 may removably connect with the cooperating connector housing the cooperating receptacles 604. The removably coupled signal pins 516 and cooperating receptacles 604 may pass signals to a central control board. Further, the current monitoring board 502 may comprise one or more digital inputs and/or outputs, one or more analog inputs and/or outputs, and be communicatively coupled with power sensors.

Example Process of Installing a Current Monitoring Device

Figure 7:
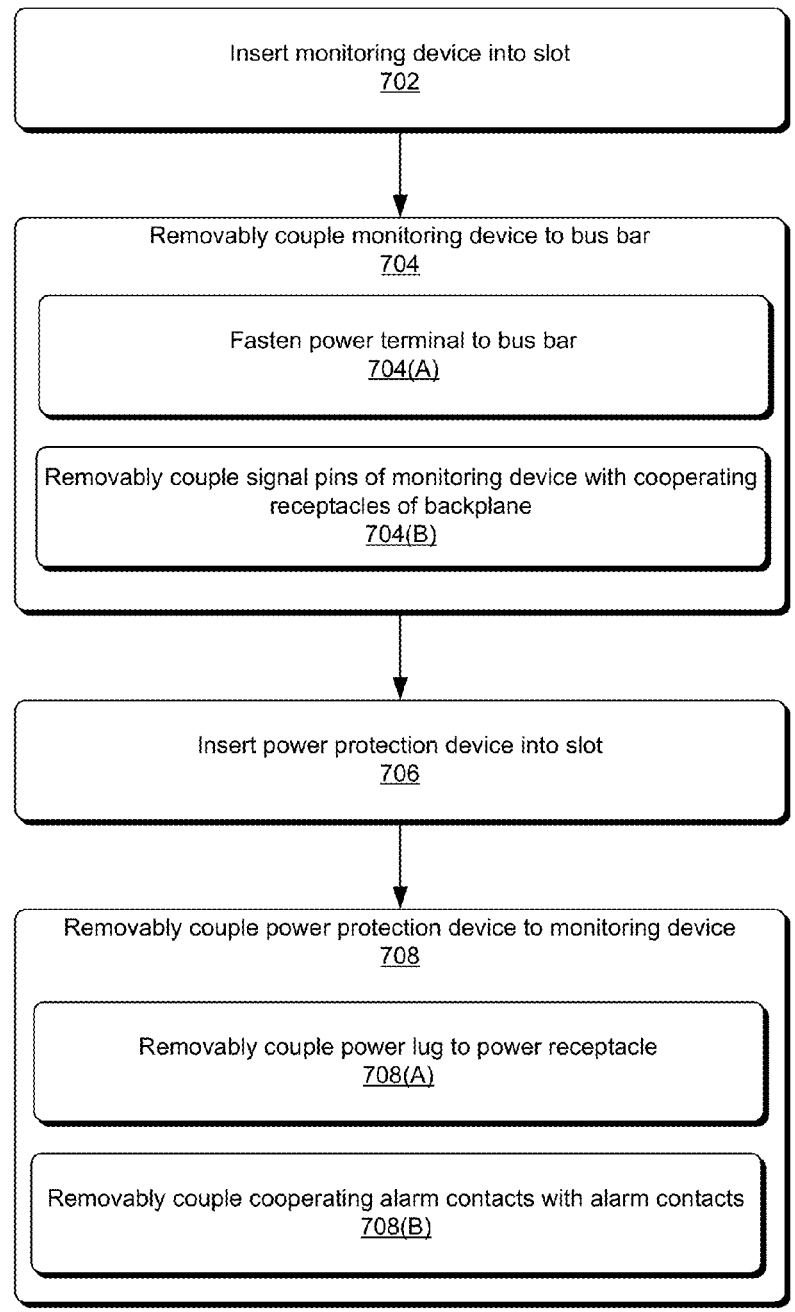
FIG. 7 is a flow diagram that illustrates an example process of installing a current monitoring device into a power distribution system.

FIG. 7 is a flow diagram that illustrates an example process 700 of installing a monitoring device into a power distribution system. For convenience, the process 700 will be described with reference to the power distribution system 104 as illustrated in FIG. 2, but the process 700 is not limited to use with this system. For example, an installer may perform this process 700 to install a monitoring device (e.g., monitoring device 502) in the power distribution system 108 and/or in the power distribution system 110. Further, the power protection device (e.g., power protection device 106) may be a fuse or a breaker. In some instances, this process may be performed in a central office, a wireless site, or in a place of residence. While this figure illustrates an example order, it is to be appreciated that the described operations in this and all other processes described herein may be performed in other orders and/or in parallel in some instances.

Process 700 begins at operation 702, where a monitoring device is inserted into a slot (e.g., slot 204 or slot 504) of a power distribution system. The slot being associated with a respective piece of telecommunication equipment. Process 700 includes operation 704, which represents removably coupling the monitoring device to an internal electrical component (e.g., bus bar 302 or backplane 536) of the power distribution system. In some embodiments, the monitoring device may comprise a power receptacle (e.g., power receptacle 210) having a through hole (e.g., through hole 308) providing access to a power terminal (e.g., power terminal 304) opposite the power receptacle. In this embodiment, process 700 may include operation 704(A), which represents fastening the power terminal to the bus bar via the through hole. For example, the power terminal may be a threaded fastener and a tool (e.g., a screw driver) may pass through the through hole to fasten the power terminal to the bus bar. In another embodiment, the monitoring device may comprise signal pins (e.g., signal pins 218(A)). In this embodiment, process 700 may include operation 704(B), which represents removably coupling the signal pins of the monitoring device with cooperating receptacles (e.g., cooperating receptacles 318(B)) of a backplane (e.g., backplane 316). In yet another embodiment, the monitoring device may comprise power input and power output receptacles (e.g., power input and power output receptacles 512(A) and 512(B), respectively). In this embodiment, operation 704(B) may represent mating the power input and power output receptacles to the backplane. Alternatively, operation 704(B) may represent removably coupling the signal pins with cooperating receptacles (e.g., cooperating receptacles 318(B)) of a harness.

Process 700 may also include operation 706, which represents inserting at least a portion of a power protection device (e.g., power protection device 106) into the slot. Process 700 may be completed at operation 708 in some instances, which represents removably coupling the power protection device to the monitoring device. In some embodiments, the power protection device may comprise a power lug (e.g., power lug 212(A)). In this embodiment, process 700 may include operation 708(A), which represents removably coupling the power lug to the power receptacle. In another embodiment, the power protection device may include cooperating alarm contacts (e.g., cooperating alarm contacts 232(B)) and the current monitoring device may include alarm contact receptacles (e.g., alarm contact receptacles 232(A)). In this embodiment, process 700 may include operation 708(B), which represents removably coupling cooperating alarm contacts of the power protection device with alarm contact receptacles of the current monitoring device. In another embodiment, the current monitoring device may comprise a fuse receptacle (e.g., receptacle 510). In this embodiment, operation 708 may represent removably coupling a fuse with the fuse receptacle.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

What is claimed is:

1. A monitoring device comprising:
   a housing having a first surface opposite a second surface;
   a mini-bus bar disposed in the housing;
   a receptacle disposed proximate to the first surface to couple a power plug of a power protection device to the mini-bus bar;
   a current monitoring device electrically coupled to the mini-bus bar to monitor a current flowing through the monitoring device and to report a signal based on the monitored current; and
   a power terminal protruding from the second surface to couple with a bus bar.

2. The monitoring device of claim 1, wherein the receptacle has a through hole providing access to the power terminal to removably couple the monitoring device to and/or from the bus bar.

3. The monitoring device of claim 1, wherein the receptacle and the power terminal are concentrically arranged in first and second tabs of the mini-bus bar.

4. The monitoring device of claim 1, further comprising a magnetic shield fixed to the mini-bus bar for shielding the current monitoring device.

5. The monitoring device of claim 1, further comprising alarm contact receptacles disposed in the first surface to removably couple with cooperating alarm contacts of the power protection device to pass trip status signals generated by the power protection device to a central control board.

6. The monitoring device of claim 1, further comprising signal pins disposed in the second surface to removably couple with cooperating receptacles of a backplane or a cable harness to pass signals to a central control board.

7. The monitoring device of claim 1, wherein each of the first and second surfaces comprise a width of about 0.85 times a width of the power protection device.

8. A sensor device comprising:
   a mini-bus bar including a power receptacle electrically coupled to a power terminal, wherein the power receptacle is configured to couple with a power plug of a power protection device and the power terminal is configured to couple with a bus bar; and
   a current monitoring assembly electrically coupled to the mini-bus bar to monitor a current flowing through the mini-bus bar and to report a signal based on the monitored current; and
   a housing enclosing the mini-bus.

9. The sensor device of claim 8, wherein the current monitoring assembly comprises a current monitor coupled to the mini-bus bar to monitor and report a current flowing through the mini-bus bar.

10. The sensor device of claim 9, wherein the current monitor comprises a Hall Effect current monitor.

11. The sensor device of claim 10, wherein the Hall Effect current monitor is disposed on a current monitor board coupled to the mini-bus bar.

12. The sensor device of claim 8, wherein the power protection device is a circuit breaker.

13. The sensor device of claim 8, wherein the current monitoring assembly comprises alarm contact receptacles to removably couple with cooperating alarm contacts of the power protection device to pass trip status signals generated by the power protection device to a central control board.

14. The sensor device of claim 8, wherein the current monitoring assembly manipulates the monitored current to be outside a valid current range based on trip status signals generated by the power protection device.

15. The sensor device of claim 14, wherein the valid current range is a pulse-width modulation duty cycle range of at least about 10% and at most about 90%.

16. The sensor device of claim 8, wherein the current monitoring assembly comprises signal pins to removably couple with cooperating receptacles of a backplane or a cable harness to pass signals to a central control board.

17. A monitoring device comprising:
a printed circuit assembly (PCA) having a first end and a second end;
power input and power output receptacles disposed proximate to the second end to couple with a backplane;
a receptacle disposed proximate to the first end and communicatively coupled to the power input and power output receptacles for receiving a power protection device; and
a current monitor arranged on the PCA between the first end and the second end.

18. The monitoring device of claim 17, further comprising signal pins fixed to the second end to removably couple with cooperating receptacles of a backplane or a cable harness to pass signals to a central control board.

19. The monitoring device of claim 17, wherein the power protection device is a fuse.

* * * * *